United States Patent [19]
Roohparvar

[11] Patent Number: 5,675,540
[45] Date of Patent: Oct. 7, 1997

[54] NON-VOLATILE MEMORY SYSTEM HAVING INTERNAL DATA VERIFICATION TEST MODE

[75] Inventor: Frankie F. Roohparvar, Cupertino, Calif.

[73] Assignee: Micron Quantum Devices, Inc., Santa Clara, Calif.

[21] Appl. No.: 589,823

[22] Filed: Jan. 22, 1996

[51] Int. Cl.$^6$ .................................................. G11C 29/00
[52] U.S. Cl. ................. 365/185.22; 365/201; 365/185.3; 365/236
[58] Field of Search .................... 365/185.22, 201, 365/200, 236, 185.29, 185.3, 189.02, 218

[56] References Cited

U.S. PATENT DOCUMENTS

| | | | |
|---|---|---|---|
| 4,860,259 | 8/1989 | Tobita | 365/201 |
| 5,177,745 | 1/1993 | Rozman | 365/201 |
| 5,233,610 | 8/1993 | Nakayama et al. | 365/201 |
| 5,265,056 | 11/1993 | Butler et al. | 365/201 |
| 5,416,740 | 5/1995 | Fujita et al. | 365/201 |
| 5,428,575 | 6/1995 | Fudeyasu | 365/201 |
| 5,463,585 | 10/1995 | Sanada | 365/201 |

*Primary Examiner*—Tan T. Nguyen
*Attorney, Agent, or Firm*—Limbach & Limbach L.L.P.

[57] ABSTRACT

A memory system including means for verifying the contents of a memory cell contained in a memory array to determine if a shift in the threshold voltage level has occurred. The memory system is placed into a test mode of operation in which an internal program or erase verify operation is executed under the control of the system's internal state machine. Once in the mode, the memory system steps through each memory cell, address by address, and reads the contents of the cell using the appropriate reference voltage for a programming or erase operation. A status register bit is set indicating successful completion of the verification operation for a block of memory cells. A register bit is also set if a cell fails the verification operation. This provides a more accurate determination of the state of a memory cell than can be achieved by performing an external read operation using read operation or data verification reference voltage levels.

31 Claims, 8 Drawing Sheets

NON-VOLATILE MEMORY SYSTEM HAVING INTERNAL DATA VERIFICATION TEST MODE

TECHNICAL FIELD

The present invention relates to non-volatile memory systems, and more specifically, to a memory system having a test mode of operation in which the data contained in the memory cells can be verified using the internal data verification process which is part of a programming or erase operation. This provides a test engineer with more reliable status information regarding the data contained in the memory cells then that obtained by performing a read operation or using external verification methods.

BACKGROUND OF THE INVENTION

In early integrated circuit memory systems, the detailed operation of the memory system was controlled directly by a processor unit which utilized the memory. This was referred to as external control of the memory system operations because the control means was external to the memory itself. Since the operation of many memory systems requires a substantial amount of processor overhead, and since different manufacturers require different operations for optimizing their particular memories, many such systems now include an internal state machine (ISM) for controlling the operation of the memory system. The internal state machine controls the execution of the primary operations of the memory system, including reading, programming and erasing of the memory cells. Each of these primary operations is comprised of a large number of sub-operations which are necessary to carry out the primary operations, with these sub-operations also being controlled by the state machine.

FIG. 1 is a functional block diagram of a conventional non-volatile memory system 1. The core of memory system 1 is an array 12 of memory cells. The individual cells in array 12 (not shown) are arranged in rows and columns, with there being, for example, a total of 256K eight bit words stored in array 12. The individual memory cells are accessed by using an eighteen bit address A0–A17, which is input by means of address pins 13. Nine of the eighteen address bits are used by X decoder 14 to select the row of array 12 in which a desired memory cell is located and the remaining nine bits are used by Y decoder 16 to select the column of array 12 in which the desired cell is located. Sense amplifiers 50 are used to read the data contained in a memory cell during a read operation or during a data verification step in which the state of a cell is determined after a programming, pre-programming, or erase operation. The sense amplifier circuitry can be combined with the data compare and verify circuits used to compare the state of a cell to a desired state or to the input data used in programming the cell.

Programming or erasing of the memory cells in array 12 is carried out by applying the appropriate voltages to the source, drain, and control gate of a cell for an appropriate time period. This causes electrons to tunnel or be injected from a channel region to a floating gate. The amount of charge residing on the floating gate determines the voltage required on the control gate in order to cause the device to conduct current between the source and drain regions. This is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

Memory system 1 contains internal state machine (ISM) 20 which controls the data processing operations and sub-operations performed on memory array 12. These include the steps necessary for carrying out programming, reading and erasing operations on the memory cells of array 12. In addition, internal state machine 20 controls such operations as reading or clearing status register 26, identifying memory system 1 in response to an identification command, and suspending an erase operation. State machine 20 functions to reduce the overhead required of an external processor (not depicted) typically used in association with memory system 1.

For example, if memory cell array 12 is to be erased (typically, all or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 15 (DQ0–DQ7), typically called an Erase Setup command. This is followed by the issuance of a second eight bit command DOH (1101 0000), typically called an Erase Confirm command. Two separate commands are used to initiate the erase operation in order to minimize the possibility of inadvertently beginning an erase procedure.

The commands issued on I/O pins 15 are transferred to data input buffer 22 and then to command execution logic unit 24. Command execution logic unit 24 receives and interprets the commands used to instruct state machine 20 to initiate and control the steps required for erasing array 12 or carrying out another desired operation. If a programming operation is being executed, the data to be programmed into the memory cells is input using I/O pins 15, transferred to input buffer 22, and then placed in input data latch 30. The data in latch 30 is then made available to sense amplifier circuitry 50 for the programming and data verification operations. Once a desired operation sequence is completed, state machine 20 updates 8 bit status register 26. The contents of status register 26 is transferred to data output buffer 28, which makes the contents available on data I/O pins 15 of memory system 1. Status register 26 permits the external processor to monitor certain aspects of the status of state machine 20 during memory array write and erase operations. The external processor periodically polls data I/O pins 15 to read the contents of status register 26 in order to determine whether an erase sequence (or other operation) has been completed and whether the operation was successful.

Memory system 1 verifies the status of the memory cells after performing programming or erasing operations on the cells. Verification occurs by accessing each memory element and evaluating the margins (the voltage differential between the threshold voltage of the memory cells and ground level) that the element has after the operation. The system then decides whether the element needs to be reprogrammed or erased further to achieve a desired operational margin.

The memory array needs to be programmed first in a pre-programming cycle before it can be erased. This is to avoid over-erasing the bits in some memory elements to a negative threshold voltage, thereby rendering the memory inoperative. During this cycle of pre-programming, the memory system needs to check to see if the bits are programmed to a sufficient threshold voltage level. This is accomplished by a pre-programming verification cycle that uses a different evaluation procedure than a regular read operation would use. After successful completion of the pre-programming cycle, a high voltage erase operation is executed. After the erase operation is completed, some memory systems go through an operation to tighten the distribution (reduce the variance) of memory element threshold voltages. This makes the manufacturing process easier and more reproducible. After this procedure, the memory system may perform a re-verify operation to determine if the data in the memory array has remained undisturbed.

FIG. 2 is a state diagram showing the process flow (sub-operations) of a memory system of the type shown in FIG. 1 during the pre-programming, high voltage erase, and distribution adjustment cycles of a complete erase operation. The complete erase operation starts with a pre-program cycle 200. This sub-operation programs all the elements in the memory array to a logic zero value to make sure that the erase process starts from a known cell threshold voltage level. This part of the complete erase operation is used to reduce the possibility of over erasure of some of the memory elements during the later steps of the operation.

The pre-program cycle begins with an operation which increments the address of the memory cell which is to be pre-programmed 202. This is done because the pre-programming operation is executed on a cell by cell basis. This step is followed by a high voltage level set-up stage 204 which prepares the system for application of the high voltage levels (typically about 12 volts is applied to the gate of each memory cell and 5 volts to the drain) used for programming or erasing a cell. The high voltage level used for writing to (programming) the cell is then applied in stage 206.

The appropriate voltage levels for executing the data verification sequence (reading the data programmed in the cell and comparing it to a desired value) are applied to the appropriate circuitry at stage 208. This is followed by a program verification stage 210 which verifies that the programmed cell has a sufficient threshold voltage margin. This is typically accomplished by comparing the threshold voltage of the cell to a reference cell having a desired threshold voltage (corresponding to a logic value of 0). If the verification operation was not successful, steps 204, 206, 208, and 210 are repeated. Once the verification stage for a particular memory cell is successfully completed, it is followed by a program clean up stage 212.

Program clean up stage 212 conditions all internal nodes of the memory array to default values in order to prepare the memory system for the next operation. This concludes the pre-programming cycle for a given memory cell. The address of the cell to be operated on is then incremented at stage 202 and the process repeats itself until the last cell in a memory block to be erased is pre-programmed. At this time, the incremented address will point to the first address location in the block, which is the first address for the next operation. When this occurs, all of the memory cells have been successfully pre-programmed and control is passed to the high voltage erase cycle 220.

In the high voltage erase cycle, the memory system performs a block erase operation on all of the cells contained in a block of memory. The first stage in the cycle is a high voltage level set-up stage 222 which prepares the memory block for application of the high voltage pulse(es) used for erasing the cells. This is followed by a high voltage stage 224 in which a short duration, high voltage pulse is applied to erase all of the memory cells in the block of cells. This is followed by a set-up verify stage 226 which applies the appropriate voltage levels for the data verification stage to the corresponding circuits. The next stage is an erase verify stage 228 which verifies that the erase operation was successfully carried out on each cell in the block. This is accomplished by accessing the cells, address by address, and comparing the threshold voltage of the cell to a reference cell having a desired threshold voltage level (corresponding to a logic value of 1).

If the erase operation was not successfully carried out (a cell was not erased to the threshold voltage margin corresponding to the desired logic value), control is passed back to the high voltage level set-up stage 222 and the high voltage cycle is carried out again to erase the entire block of cells. If the erase operation was successful for the cell under consideration, the address of the memory cell is incremented 230 and the next cell is tested for verification of the erase operation. Thus, if the maximum address of the cells in the block of memory has not been reached, erase verify stage 228 is carried out on the next memory cell in the block. If the maximum address for cells in the block has been reached (meaning that all the cells in the memory block have been successfully erased), control is passed to the distribution adjustment cycle 240.

The distribution adjustment sub-operation is used to tighten the distribution (reduce the variance) of the threshold voltages of the erased memory elements. This is done by applying high voltages (i.e., 12 volts) to the gates of all the memory cells in the memory block, with the memory cell drains floating and the sources at ground potential.

The distribution adjustment cycle begins with a high voltage set-up stage 242, which is followed by a high voltage stage 244 in which the voltages used to perform the adjustment sub-operation are applied. This is followed by set-up verification 246 stage which applies the appropriate voltage levels to the corresponding circuits, and erase verification 248 stage which acts to insure that all of the erased cells are still in an erased state. If the erase verification procedure fails, a final erase 249 stage may be executed. In the final erase stage, a short erase pulse is applied to the cells in the block. After completion of the previous steps, the memory elements are checked to determine if they still contain the appropriate data. At this point the erase operation is completed.

A programming operation is carried out by following a set of steps similar to those followed in pre-program cycle 200 of FIG. 2. In particular, stages 204 through 212 of FIG. 2 describe the primary functions carried out in a regular programming operation. As a program operation is typically carried out on a specific memory cell, the increment address state 202 used in the pre-program cycle to facilitate pre-programming of every cell in the memory array is not accessed. Another difference between the programming and pre-programming operations is that in a programming operation, program verify state 210 is designed to read the programmed data and compare it to data obtained from input data latch 30, rather than to a logic value of zero, as in the pre-programming operation.

As noted, in both the pre-programming and high voltage erase cycles of a complete erase operation, and in a programming operation, the state of a memory cell is verified to determine if the operation was successfully executed. This is accomplished by an internal data verification stage which is performed under the control of the internal state machine. If a memory cell does not pass the verification stage, the pre-programming, programming, or high voltage erase stage is repeated until the cell successfully passes the verification procedure, or until the high voltage pulse counter reaches its maximum value. At this point the operation is terminated and a status bit (contained in status register 26) is set indicating a problem with the block of memory cells.

There are some situations in which a test engineer is interested in knowing the status of a memory cell which has previously been programmed or erased. For instance, memory systems of the type shown in FIG. 1 are often manufactured well in advance of their sale and/or usage in other devices. In order to check whether the memory cells have maintained their previously set threshold voltage after an extended period of time, it is useful to conduct a data verification operation on the cells. Such an operation can also be used to determine the rate at which electrons are leaking from the floating gate by performing a data verification operation with a variable reference voltage. A test engineer may also be interested in knowing the status of a memory cell or block of cells after execution of a pre-programming, programming, or erase cycle but without having the memory system repeat the cycle until it is successful. This allows an examination of the effect of the high voltage pulses used in the programming and erase operations on the threshold voltages of the memory cells.

One means of determining the status of a memory cell in such instances is to perform a read operation on the cells. The sense amplifier employed in normal reading as well as data verification operations (e.g., sense amplifier 50 of FIG. 1) is typically a differential amplifier having two input signals: a signal from the selected cell indicative of the cell's threshold voltage, $V_{th}$, and a reference signal corresponding to a reference threshold voltage, $V_{ref}$. In a normal read operation, reference voltage $V_{ref}$ is typically 4 volts, and the measured threshold voltage $V_{th}$ is typically 3 volts or 5.5 volts, depending on whether the cell stores a "1" or a "0" bit. Thus, the sense amplifier operates with a substantial noise margin during a normal read operation because there is a significant voltage range between $V_{ref}$ and the programmed or erased threshold voltage of a cell. The use of such a noise margin allows an accurate determination of whether the memory cell is programmed or erased. However, it provides little information regarding small, but potentially important changes in the threshold voltage of the cell caused by electrons leaking from the floating gate of the cell.

One method for performing an externally controlled verification procedure is described in U.S. Patent Application Ser. No. 08/511,614, filed Aug. 4, 1995, entitled "Memory Circuit for Performing Threshold Voltage Tests on Cells of a Memory Array", the contents of which is hereby incorporated in full by reference. In the above-identified patent application, a test mode of operation is described in which a data verification operation is performed on a memory cell by executing a read operation on the cell using a program or erase verification value for the reference voltage instead of the normal read operation value. Although this has the benefit of setting the reference voltage level at values which provide a more accurate assessment of the state of the memory cell, the method does have a disadvantage. This disadvantage will be explained with reference to FIG. 3, which is a block diagram of a prior art data input/output circuit 300 for programming memory cells of a non-volatile memory array, and for reading data indicative of the state of those cells.

As shown in FIG. 3, an input/output pad 302 is connected to circuit elements which form a data read path 304 and a data write path 306 to a memory array (not shown). Pad 302 is part of the metallization of the integrated circuit containing the memory array and is connected by means of a wire bond to a data pin of the integrated circuit package. There is one data input/output circuit 300 associated with each data input/output line of the memory, with there typically being eight or sixteen data input/output lines depending upon the memory architecture.

Read path 304 and write path 306 are electrically connected to data line 308, which connects those paths to the memory array by means of decoding multiplexer 310. Decoding multiplexer 310 functions to connect read path 304 and write path 306 to a selected one of the plurality of bit lines of the array, where one of the bit lines is represented by line 312. The selected bit line, which is determined by an address provided to the memory, is connected to the drain of the memory cell being read or programmed.

Write path 306 includes a data latch 314 for storing data input by means of pad 302. Latch 314 is activated or enabled by latch enable signal 315. The latched data is sent to data input buffer or driver 316, which produces the voltage on line 318 which is applied to the bit line of the cell to be programmed. Input buffer 316 is typically implemented in the form of a tri-statable driver having an output which can be placed in a high impedance mode and effectively disabled during a read operation. The disabling of input buffer 316 is achieved by means of tri-state control line 317.

As noted, decoding multiplexer 310 is used to access a desired memory cell in the array for purposes of reading data from or writing data to that cell. When reading a memory cell of the array, multiplexer 310 is used to access the bit line connected to the selected memory cell in the array. In the event the cell being read is in an erased state, the cell will conduct a current which is converted to a voltage on line 308. Sense amplifier 320 determines the state of the cell, i.e., whether it is programmed or erased (corresponding to a binary value of 0 or 1, respectively). This determination is based on comparing the voltage on lines 308 and 312 to a reference voltage. The outcome of this comparison between the two input voltages is an output which is either high or low, corresponding to a digital value of one or zero. The output of sense amplifier 320 is sent to output buffer 322 which drives the data to output pad 302 where it is accessed by a user.

During a normal read operation in which the reference voltage is approximately 4 volts (so that a wide noise margin is present), the large differential between the inputs to the sense amplifier results in a stable, unambiguous output. This is because noise in the circuit is generally insufficient in magnitude to produce a false positive in the output of the sense amplifier. As a result, the output is stable and the output buffer only generates an output in response to a single change in the sense amplifier signal.

However, when conducting a read operation using the reference voltage levels typically used for a data verification operation, the inputs to the sense amplifier have a much smaller differential. During an internal data verification stage of the type shown in FIG. 2 (i.e., stage 210 or 228), the reference voltage ($V_{ref}$) for a programming operation verification is typically set at 5.5 volts, and an adequately programmed cell has a measured threshold voltage ($V_{th}$) greater than 5.5 volts. Since the two inputs of the sense amplifier are much closer to each other in this case than for a regular read operation, the sense amplifier's output is more susceptible to error due to noise and the sense amplifier responds much more slowly. Similarly, during data verification following a high voltage erase operation, the reference voltage ($V_{ref}$) is typically set at 3 volts and an adequately erased cell has a measured threshold voltage ($V_{th}$) less than 3 volts. In this case, the two inputs of the sense amplifier are also much closer than in a regular read operation and the sense amplifier's output is again more susceptible to noise. With noise of sufficient magnitude to produce a false positive, noise fluctuations will cause the sense amplifier output to be unstable. The output buffer will generate an output in response to the fluctuating sense amplifier output. This produces noise on a power supply pin (corresponding to $V_{cc}$, the power supply voltage, or ground) which is fed back to the sense amplifier.

The noise fed back to the sense amplifier can alter the output of the sense amplifier due to the small noise margin of the data input/output circuit when used with data verification reference voltage levels. Thus, while this test mode of data verification is superior to a normal read operation, it is still susceptible to error owing to the noise produced by the output buffer. Another disadvantage of this externally controlled data verification procedure is that it requires the test engineer to specify the address(es) of the memory cells to be verified. This increases the time required to verify the contents of a large number of memory cells.

Yet another disadvantage of an externally controlled verification procedure which uses the regular read operation sensing path is that it requires the test engineer to specify the delay between the time the read operation is initiated and when the data indicating the state of the cell is read out. This user specified delay is unlikely to match the delay the internal state machine uses during its internally controlled verification process. The difference between the two time delays can lead to inconsistent results between the two procedures, and hence cause difficulties in correlating the results of the two verification processes.

What is desired is an apparatus which can more accurately verify the status of a programmed or erased memory cell than can be obtained by using a standard read operation. It is also desired that the apparatus not be susceptible to errors caused by noise introduced by the circuit elements used to perform the verification operation.

SUMMARY OF THE INVENTION

The present invention is directed to a memory system which includes means for verifying the contents of a memory cell contained in a memory array to determine if a shift in the threshold voltage level has occurred. In one embodiment, the memory system is placed into a test mode of operation in which an internal program or erase verify operation is executed under the control of the system's internal state machine. Once in the test mode, the memory system steps through each memory cell, address by address, and reads the contents of the cell using the appropriate reference voltage for a programming or erase operation. A status register bit is set indicating successful completion of the verification operation for a block of memory cells. A register bit is also set if a cell fails the verification operation. The verification operation described provides a more accurate determination of the state of a memory cell than can be achieved by performing an external read operation using read operation or data verification reference voltage levels.

Further objects and advantages of the present invention will become apparent from the following detailed description and accompanying drawings.

DETAILED DESCRIPTION OF THE INVENTION

The inventor of the present invention has recognized that the accuracy, noise, and correlation problems inherent in performing an external data verification operation using a read operation can be overcome by performing an internal data verification operation under the control of a memory system's internal state machine. This can be achieved by placing the memory system into an internal verify test mode and then executing a data verification operation in which the memory cells are read and their state determined using a programming or erase operation reference voltage level. This provides a more accurate determination of the threshold voltage of the memory cells then can be obtained using a normal read operation reference voltage level. In addition, this verification method is not subject to the noise problems which occur when executing an external read operation. Furthermore, since the internal state machine uses the same timing sequence for the internal verify test mode as for the normal data verification process, the problem of correlating the results obtained from the two processes does not arise. The result is a data verification method which is more consistent with the internal verification operation which is executed during the cycles of a complete erase operation.

Figure 4:
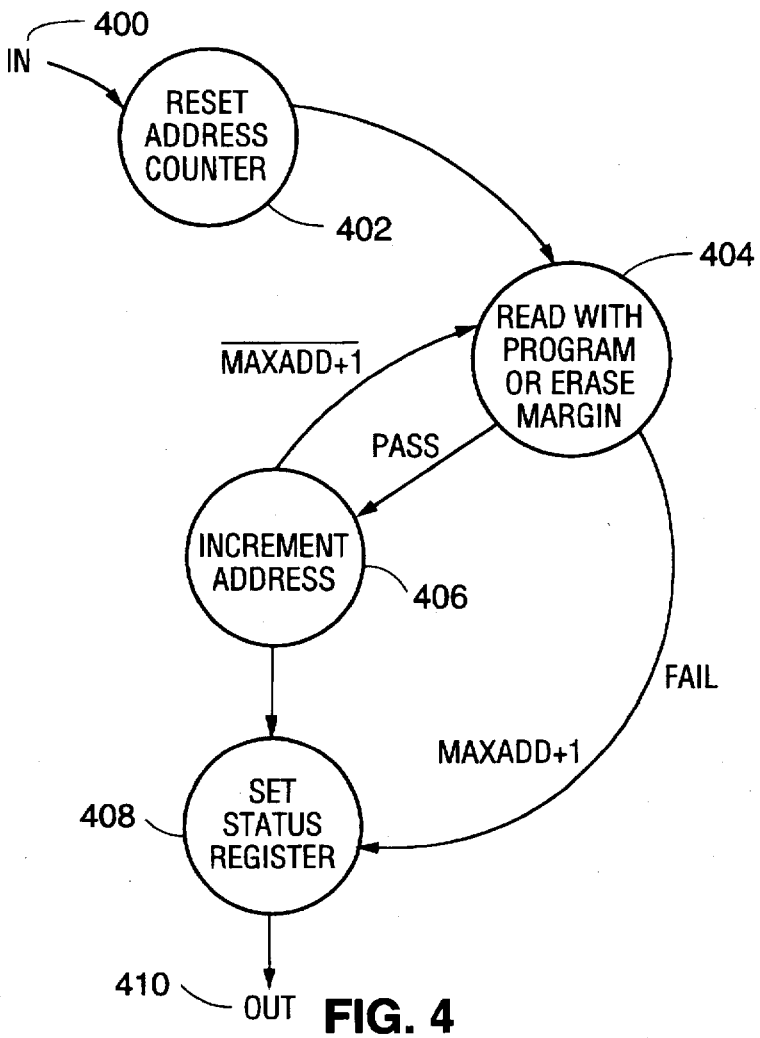
FIG. 4 is a state diagram showing the process flow of the internal program or erase verify operation of the present invention.

FIG. 4 is a state diagram showing the process flow of the internal program or erase verify operation of the present invention. As has been discussed, the internal data verification operations performed by a memory system of the type shown in FIG. 1 involve determining whether a memory cell conducts current for a given reference voltage. In effect, this is determining whether the threshold voltage of the cell falls above or below the reference voltage.

As shown in FIG. 4, once the memory system is placed into the internal verify test mode, the internal state machine causes the memory system to enter the internal program/erase verify mode at stage 400. The address counter (element 52 of FIG. 1) which determines the address of the memory cell operated on is reset at stage 402. A read (data compare) operation is then performed on the memory cell at stage 404. The read operation is performed using the sense amplifier circuitry of FIG. 1, but with the reference voltage set to either the program or erase state reference level, depending on the specified test mode. The data to which the read data is compared is obtained from input data latch 30. It is noted that the data contained in latch 30 can be all zeros (as in a pre-programming verify operation), all ones (as in an erase verify operation), or a set of user provided data. If the memory cell passes the read operation (the threshold voltage margin of the cell is appropriate when compared to the program or erase state reference voltage), then control is passed to stage 406 where the memory cell address is incremented. If the maximum cell address for memory cells in a block of cells has not been reached, control is passed back to stage 404 and the read operation is performed on the cell corresponding to the new address.

If the memory cell fails the read operation, control is passed to stage 408 where a status register bit signifying an error in the data verification operation is set and the verification operation on the block of cells is terminated. When all of the memory cells in a block of cells successfully pass the verification operation and the maximum cell address for memory cells in the block of cells is reached (the address counter is set to maximum address plus one), control is passed to stage 408 where a status register bit signifying successful completion of the data verification operation is set. The setting of a bit in the status register indicating the success or failure of the internal verification operation permits a test engineer to monitor the outcome of the operation without having to check whether each memory cell individually passes or fails the verification procedure.

The internal data verification mode of FIG. 4 is accessed by placing the memory system into a test mode of operation and then entering the appropriate code(s) to cause the internal state machine to execute either the program or erase verify mode. This differentiates the internal verification test mode of the present invention from the normal data verification procedures which occur during the complete erase cycle of FIG. 2. One method for placing the memory system into a test or special mode of operation is described in U.S. Pat. No. 5,526,364, entitled, Apparatus for Entering and Executing Test Mode Operations for Memory, issued Jun. 11, 1996, the contents of which is hereby incorporated in full by reference.

Figure 5:
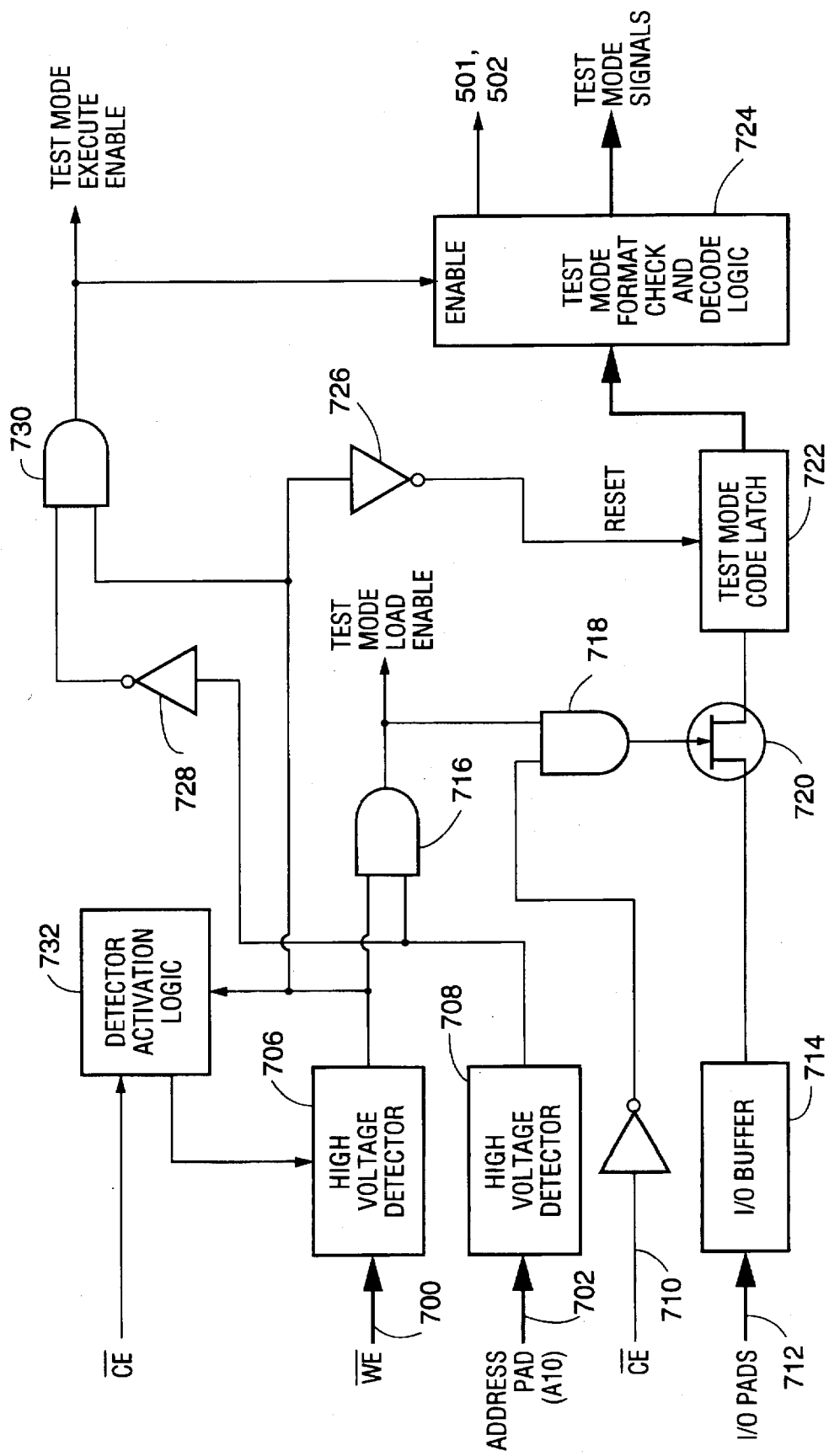
FIG. 5 is a schematic of a circuit for a detector/decoder which can be incorporated into a memory system and used for entering a test mode of operation in which code signal(s) used to initiate the internal data verification mode can be input.

FIG. 5 is a schematic of a circuit for a detector/decoder (see element 102 of FIG. 6) which can be incorporated into a memory system and used for entering a test mode of operation in which code signal(s) used to initiate the internal data verification mode can be input. In order to place the memory system into a mode of operation in which the internal data verification operation is executed, the test mode must be entered and the test mode command signals corresponding to the appropriate internal verify mode must be applied to the data I/O terminals of the memory.

Typically, the end user of the memory system would have no reason to cause the memory system to enter a test or special mode of operation since this mode is intended to be used by test engineers at the memory fabrication facility. Furthermore, accidental entry into such a mode is to be avoided since the memory could be rendered permanently inoperable in this mode. Thus, the test mode entry circuitry of FIG. 5 is designed to reduce the likelihood of accidental entry into the mode by requiring simultaneous application of high voltages to multiple memory system terminals.

The circuit of FIG. 5 is activated by application of a high voltage to two or more terminals 700 and 702 of the memory system from an external source. These terminals are non-dedicated terminals used during normal memory operations. Terminals 700 and 702 may include, for example, address terminal (pad) A10 and the write enable terminal $\overline{WE}$. The magnitude of the high voltage applied to terminals 700 and 702 is chosen to be outside of the range of voltages which would typically be applied to those terminals during use of the terminals in normal (non-test mode) operation of the memory system. This is done to prevent an end user from unintentionally entering the test or special mode. The high voltage applied to terminals 700 and 702 is detected by detectors 706 and 708. A detector circuit suited for use in constructing detectors 706 and 708 is described in U.S. Patent Application Ser. No. 08/493,162, entitled, "Integrated Circuit Having High Voltage Detection Circuit", filed Jun. 21, 1995, the contents of which is hereby incorporated in full by reference.

After application of the high voltage to terminals 700 and 702, a signal on another terminal 710, in this case the chip enable $\overline{CE}$ terminal, is made active (low). Code signal data corresponding to one of several possible test or special modes is placed on the data I/O terminals 712 of the memory system and forwarded to an I/O buffer 714. In the present case, code data corresponding to an internal data verify operation would be input. Note that data I/O terminals 712 and I/O buffer 714 of FIG. 5 correspond, respectively, to data I/O pins 15 and input buffer 22 of FIG. 1.

An AND gate 716 provides a test mode load enable signal when the outputs of both high voltage detectors 706 and 708 indicate that an appropriate high voltage is being applied to terminals 700 and 702. The load enable signal is coupled to one input of an AND gate 718 together with an inverted signal $\overline{CE}$. This causes AND gate 718 to turn on pass transistor 720 which forwards the test or special mode code data entered by means of I/O pads 712 to buffer 714 and then to a test mode code latch 722. Separate I/O terminals and pass transistors 720 are used for each bit of input test or special mode data so that the data will be loaded into latch 722 in parallel. Typically there are a total of eight bits of test code data so that latch 722 will contain eight bits. Signal $\overline{CE}$ is then brought back to a high state, thereby latching the code data in latch 722.

After latch 722 has been loaded with the code data, one of the high input voltages, such as the input to address A10 terminal 702 is removed so that the output of detector 708 will go low thereby providing a high input to an AND gate 730 by way of inverter 728. Since the remaining input of gate 730, the output of the second high voltage detector 706, will still be high, gate 730 will produce a test or special mode enable signal. Among other things, this will enable a Test Mode and Format Check and Decode Logic unit 724 which will verify that the data in latch 722 corresponds to a proper test or special mode. In addition, unit 724 will decode the mode code to determine which one of approximately fifteen different special or test modes has been entered. These modes each have an associated mode signal which is produced by the Test Mode and Format Check and Decode Logic unit 724 and which is used by the memory system in combination with other signals for carrying out the various test or special mode functions.

The system will remain in the selected mode as long as the voltage applied to terminal 700 remains high. When signal CE is brought back to a high state, detector activation logic 732 keeps detector circuits 704 and 706 enabled as long as the voltage applied to terminal 700 remains high. During the course of carrying out the various test or special mode operations, it may be necessary to periodically change the state of the chip enable CE signal. However, since address A10 on line 702 has been shifted to a low state, the low output of AND gate 718 will prevent any change in the contents of mode code latch 722. Once the test or special mode of operation is completed, the high voltage applied to terminal 700 is removed, thereby causing the output of AND gate 730 to go low and end the test or special mode of operation.

The test mode codes loaded into latch 722 are preferably of a specific format which further reduces the possibility of accidental entry into a test mode. The mode code is typically divided into two groups of bits, with the first group of bits, the format bits, signifying a test or special mode of operation and the remaining bits signifying a particular one of the modes. A description of a code format suited for use with the present invention can be found in the previously mentioned U.S. Pat. No. 08/386,704, entitled, "Apparatus for Entering and Executing Test Mode Operations for Memory".

With regards to the present invention, after placing the memory system into a test or special mode by using the appropriate type and sequence of high voltage signals, a user would enter test code(s) or signals corresponding to an internal program or erase verify test mode. This will cause the memory system's internal state machine to execute the internal data verification operation shown in FIG. 4 with the appropriate reference voltage. This will result in stepping through the memory cells, address by address, and verifying that the cells are programmed or erased with the proper threshold voltage margins. At the conclusion of the verification process (or during the process, in the case of a verification error), a status register bit which indicates the success or failure of the data verification operation will be set.

As noted, one method of performing the internal data verify operation of the present invention is to execute the process flow of FIG. 4 as an independent operation. However, it is also possible to execute the relevant stages of the complete erase operation shown in FIG. 2, while skipping the irrelevant stages. This can be accomplished by instructing the memory system to disable or skip the appropriate stages of the pre-programming or high voltage erase cycle of the complete erase operation. One method for performing this function is described in U.S. Patent Application Ser. No. 08/508,921, entitled "Memory System Having Programmable Flow Control Register", filed Jul. 28, 1995, the contents of which is hereby incorporated in full by reference.

Figure 6:
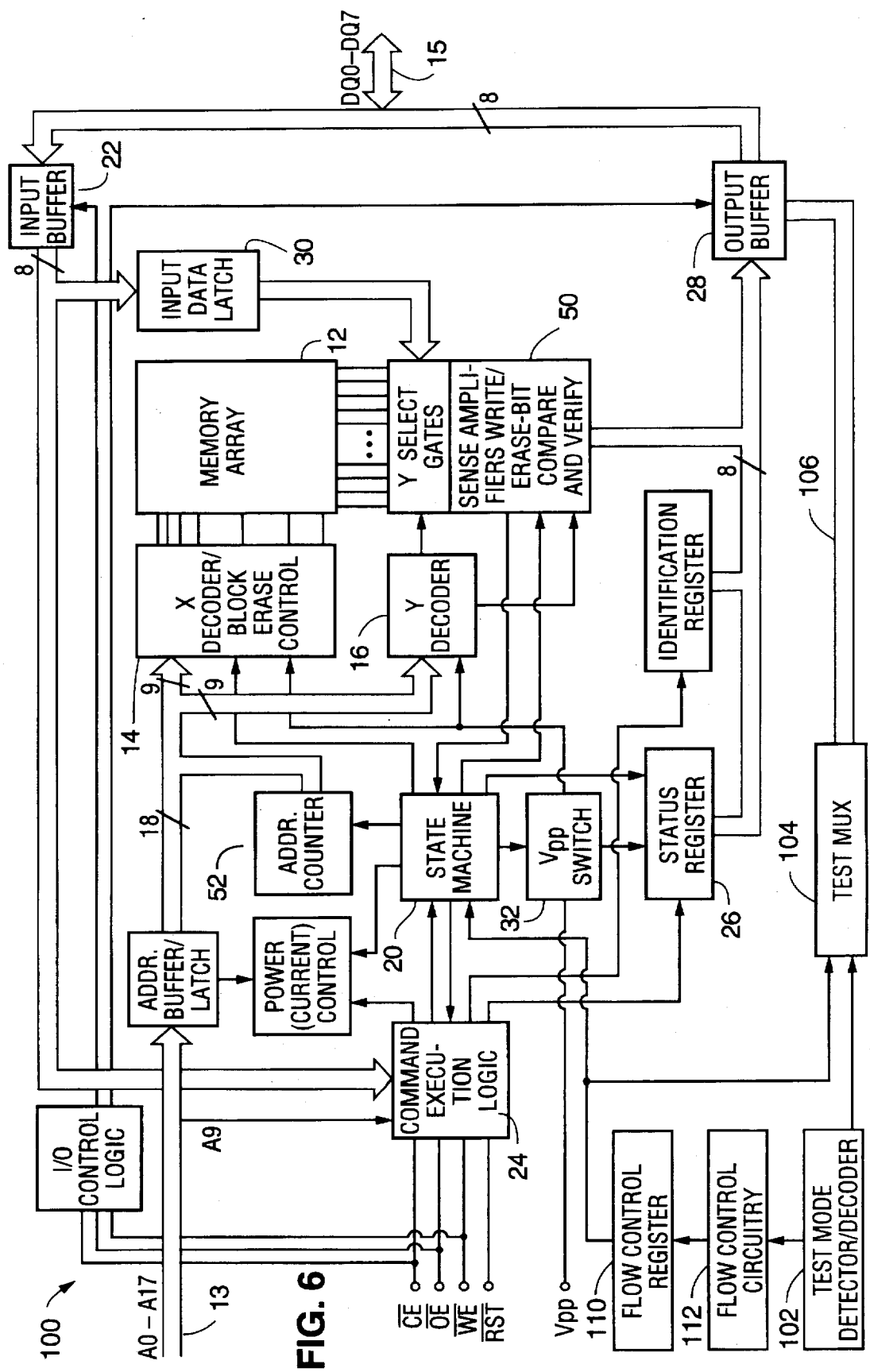
FIG. 6 is a functional block diagram of a memory system which includes a flow control register for altering the process flow of the operations and sub-operations carried out by the system's internal state machine.

FIG. 6 is a functional block diagram of a memory system 100 which includes a flow control register 110 for altering the process flow of the operations and sub-operations carried out by the system's internal state machine 20. It is noted that FIG. 6 is meant to be suggestive of the connections between flow control register 110, its associated circuitry 112 and the rest of the memory system, and that not all interconnections are shown. It is also noted that similar reference numbers in FIGS. 1 and 6 refer to the same signals and components in the two figures.

Figure 1:
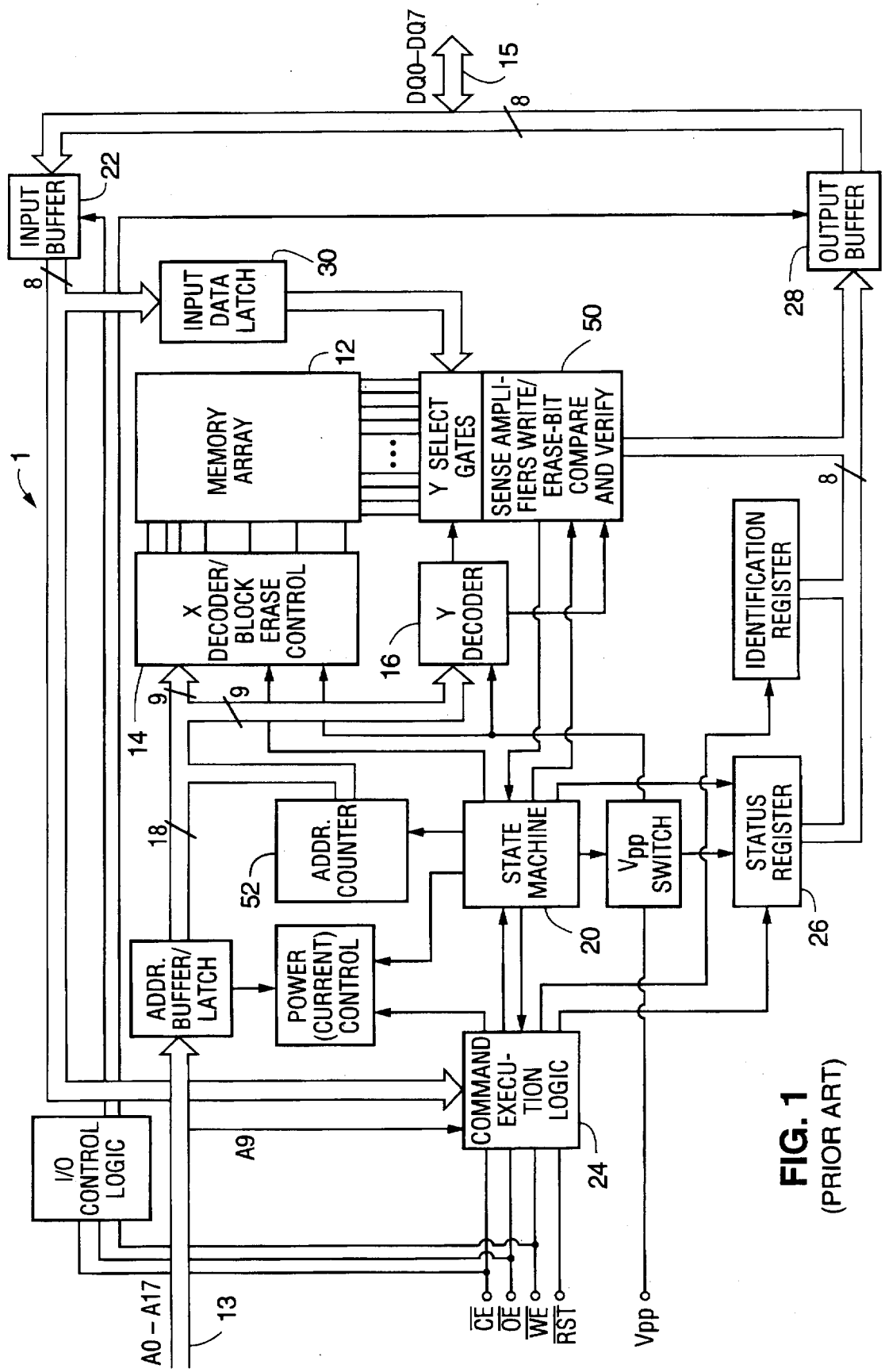
FIG. 1 is a functional block diagram of a conventional non-volatile memory system.

As with the memory system of FIG. 1, the core of memory system 100 is an array 12 of memory cells. The individual memory cells (not shown) are accessed by using an eighteen bit address A0–A17, which is input by means of address pins 13. Memory system 100 contains internal state machine (ISM) 20 which controls the data processing operations and sub-operations performed on memory system 100, such as the steps necessary for carrying out programming, reading and erasing operations on the memory cells of array 12. Internal state machine 20 is typically implemented in the form of a set of logic gates whose inputs determine which operations and sub-operations of the memory system are carried out, and in what order those operations occur.

Memory system commands are issued on I/O pins 15, and are transferred to data input buffer 22 and then to command execution logic unit 24. Command execution logic unit 24 receives and interprets the commands used to initiate and control the steps required for erasing array 12 or carrying out another desired operation. If a programming operation is being executed, the data to be programmed into the memory cells is input using I/O pins 15, transferred to input buffer 22, and then placed in input data latch 30. The data in latch 30 is then made available to sense amplifier circuitry 50 for the programming and data verification operations. Once an operation is completed, state machine 20 updates 8 bit status register 26. The contents of status register 26 is transferred to data output buffer 28, which makes the contents available on data I/O pins 15 of memory system 100.

Memory system 100 includes a test mode detector and decoder 102 used for entry into a test or special mode of operation in which the contents of flow control register 110 may be read or altered, and code signals used for executing an internal data verification operation may be input. Details of the implementation of the detector/decoder 102 were previously described with reference to FIG. 5.

Figure 2:
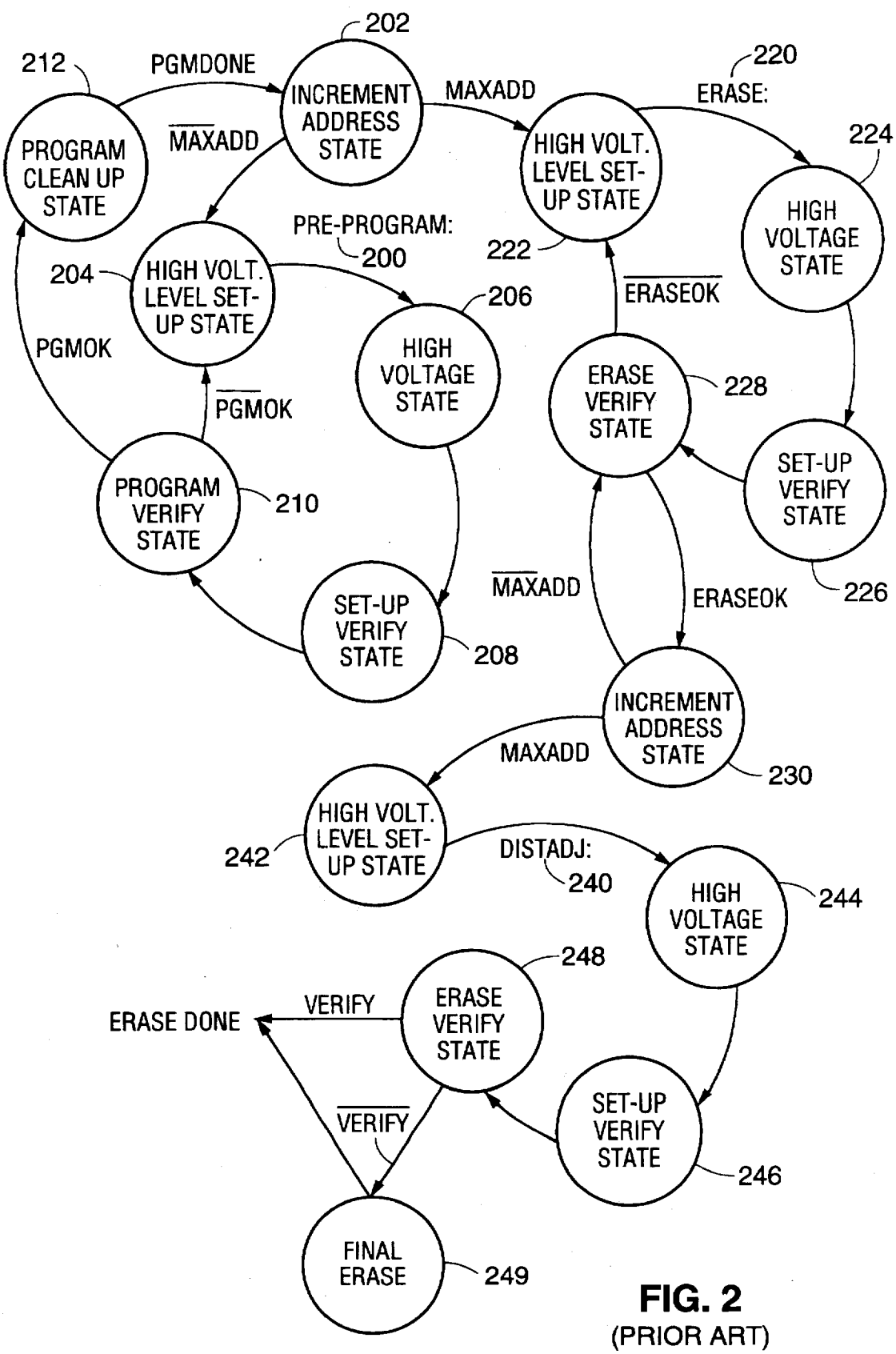
FIG. 2 is a state diagram showing the process flow (sub-operations) of a memory system of the type shown in FIG. 1 during the pre-programming, high voltage erase, and distribution adjustment stages of a complete erase operation.

Flow control register 110 contains data used to alter the process flow of the memory system. This is accomplished by instructing internal state machine 20 to include or bypass certain operations or sub-operations, examples of which are shown in FIG. 2. Individual bits within register 110 are used to determine the operations and sub-operations carried out under control of internal state machine 20. For example, by setting a bit or bits of register 110, the flow may be modified to bypass the erase high voltage (step 222 of FIG. 2) or distribution tightening cycles (step 240 of FIG. 2) of the complete erase operation. If it is desired to read the contents of control register 110, that data may be routed through test signal switch 104 to output buffer 28 by means of data bus 106, and made available to a system designer.

Figure 7A:
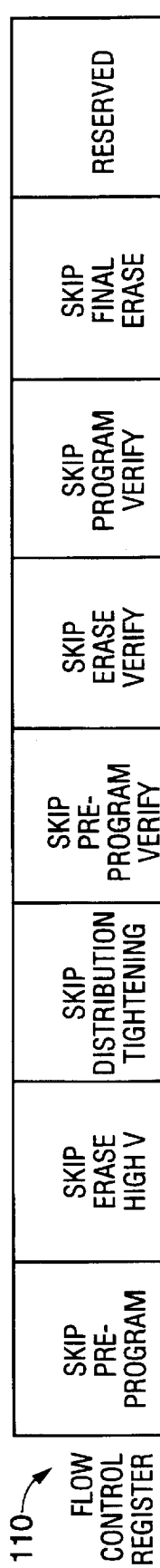
FIGS. 7A and 7B show the contents of two embodiments of a flow control register of the type shown in FIG. 6.
Figure 7B:
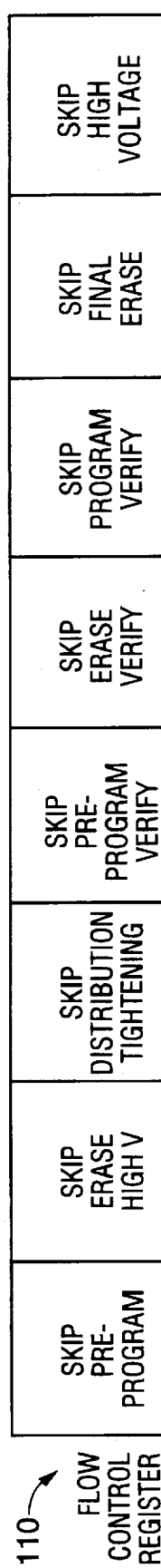

FIGS. 7A and 7B show the contents of two embodiments of flow control register 110. It is noted that the difference between the two embodiments is that in FIG. 7A, bit one is reserved, while in FIG. 7B, bit one is used to skip the high voltage stages of a desired cycle of the complete erase operation. As shown in FIGS. 7A and 7B, flow control register 110 is implemented as an 8 bit storage medium. Flow control register 110 may be implemented in the form of a volatile or a non-volatile storage medium, or a combination of the two. If implemented as a volatile medium, register 110 must be re-programmed each time the system is powered up. This can be accomplished by means of flow control register circuitry 112. Flow control register 110 may also be implemented in the form of a storage medium having a volatile and a non-volatile portion. In this case, register 110 would contain non-volatile memory elements which were programmed by circuitry 112 to values corresponding to the desired bit values of the flow control register. When power is applied to the memory system, the contents of the non-volatile portion of the flow control register would be copied to the volatile portion of the flow control register. This section would then control the operation of the state machine. Further details of a method of implementing flow control register 110 can be found in the previously mentioned U.S. Pat. Application Serial No. 08/508,921, entitled "Memory System Having Programmable Flow Control Register", and in U.S. Patent Application Ser. No. 08/508, 864, entitled, "Non-volatile Data Storage Unit and Method of Controlling Same", filed Jul. 28, 1995, the contents of which is hereby incorporated in full by reference.

The value of each bit of flow control register 110 corresponds to an instruction to internal state machine 20 to include or bypass the indicated operation or sub-operation, i.e., skip program verify, erase verify, high voltage stage, etc. Depending on the value of the bits, the indicated cycle or stage in the process flow of the memory system is either implemented or bypassed. Combinations of bits (multiple bits) may also be used to instruct the internal state machine to include or bypass certain operations or sub-operations. It is noted that a memory system designer can place as many bits as necessary in register 110 to create as much flexibility in modifying the operation of the memory system as is desired. It is well known to those skilled in the art how to construct a logic circuit which uses the value of the indicated bit(s) of flow control register 110 to alter the operations and sub-operations carried out by an internal state machine.

One means of conducting a programming operation data verification is to use the pre-programming cycle of a complete erase operation to access a memory cell, verify that a zero has been written to the accessed cell, and then proceed to the next cell. Executing this cycle will also cause a bit to be set in the status register indicating the success or failure of the data verification operation carried out during the cycle. Execution of the pre-programming cycle can be accomplished by two methods, depending upon whether the embodiment of FIG. 7A or 7B of flow control register 110 is used. If the flow control register of FIG. 7A is used, then it is necessary to set the bits of flow control register 110 so that the erase high voltage 220 and distribution adjustment 240 cycles are skipped. This corresponds to setting bits 7 and 6 of the flow control register shown in FIG. 7A. In addition, it is necessary that the high voltage stages of the pre-programming cycle be skipped. This is accomplished by having the memory system operate so that entry into the program verify test mode automatically generates a control signal which causes the internal state machine to skip the high voltage stages of the complete erase operation. If the pre-programming cycle is then executed (by instructing the internal state machine to execute a complete erase operation), the internal state machine will access each memory cell and verify that a zero has been written to the cells.

Similarly, in order to conduct an erase operation data verification, the high voltage erase cycle of a complete erase operation can be used to access a memory cell, verify that a one has been written to the accessed cell, and then proceed to the next cell. As with the execution of the pre-programming cycle, a bit will be set in the status register indicating the success or failure of the erase operation data verification. Execution of the high voltage erase cycle can be accomplished by setting the bits of flow control register 110 so that the pre-programming 200 and distribution adjustment 240 cycles are skipped. This corresponds to setting bits 8 and 6 of the flow control register embodiment of FIG. 7A. In addition, it is necessary that the high voltage stages of the high voltage erase cycle be skipped. As discussed, this is accomplished by having the memory system operate so that entry into the erase verify test mode automatically generates a control signal which causes the internal state machine to skip the high voltage stages of the complete erase operation. If the high voltage erase cycle is then executed (by instructing the internal state machine to execute a complete erase operation), the internal state machine will access each memory cell and verify that a one has been written to the cells.

Figure 3:
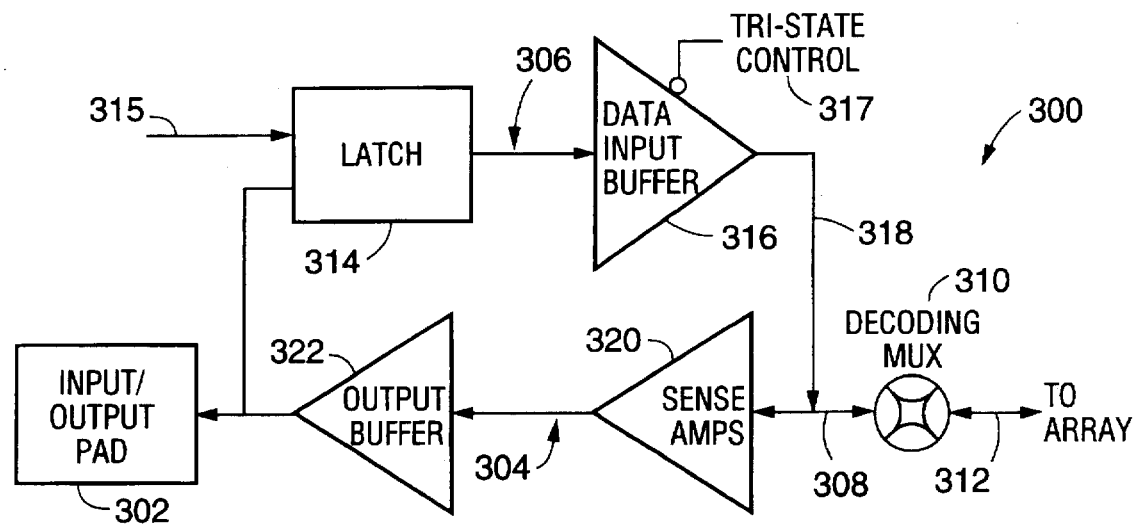
FIG. 3 is a block diagram of a prior art data input/output circuit for programming memory cells of a non-volatile memory array, and for reading data indicative of the state of those cells.

In the embodiments of the present invention just discussed, the user is responsible for entering the program or erase verify test mode and setting the contents of flow control register 110 to the appropriate values for skipping the desired cycles and/or stages of the complete erase operation. However, this function may also be executed automatically upon entry into the test mode and input of the appropriate internal verify code. This is accomplished by having Test Mode and Format Check and Decode Logic unit 724 of detector/decoder 102 produce a flow control register control signal (signal 501 or 502 of FIGS. 3, 8, and 9) when the internal verify test mode is entered. Flow control register control signal 501 or 502 (or the inverted signal) serves as a first input to a set of logic gates, with the other input to each gate being the value of one of the bits of flow control register 110. The outputs of the logic gates serve as the control signals to the state machine to cause the desired cycles or stages of a complete erase operation to be skipped.

Figure 8:
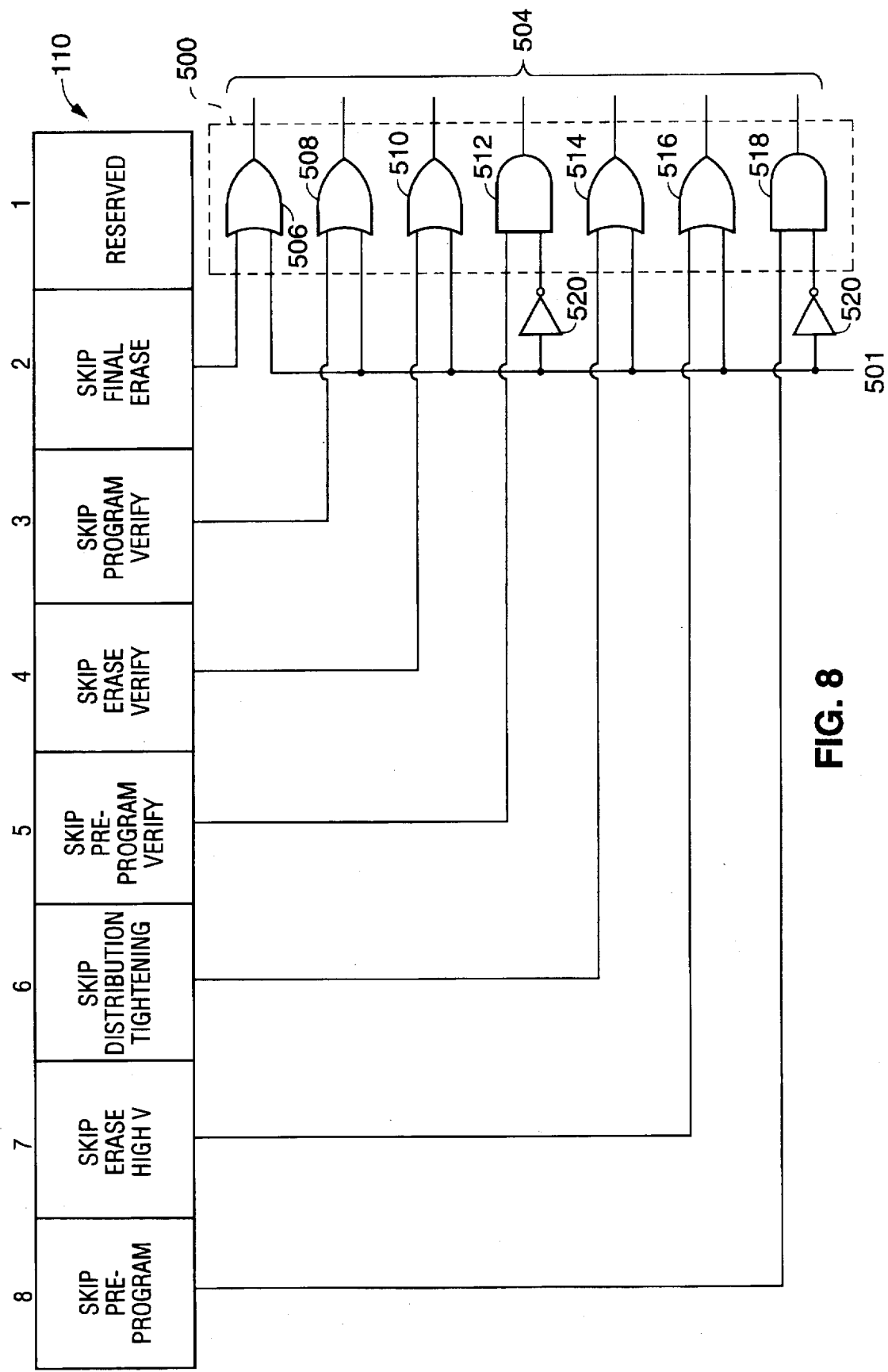
FIG. 8 shows a set of logic gates which can be used in conjunction with a flow control register control signal to automatically provide signals to cause a state machine to implement an internal program verify mode by skipping the desired cycles or stages of a complete erase operation.

FIG. 8 shows a set of logic gates 500 which can be used in conjunction with flow control register control signal 501 to automatically provide signals 504 to cause state machine 20 to implement an internal program verify mode by skipping the desired cycles or stages of a complete erase operation. As shown in the figure, logic gates 500 comprise a set of two-input OR gates (gates 506, 508, 510, 514, and 516) and two-input AND gates 512 and 518. A first input to each logic gate 500 is a signal representing the contents of each bit of flow control register 110. Thus, one input to each logic gate 500 is a high (logic 1) or low (logic 0) value corresponding to the value of each bit of register 110. The second input to each logic gate 500 is flow control register control signal 501 or an inverted version of that signal. The inverted version is provided by an inverter 520 placed in the signal path between signal 501 and the second input to the appropriate logic gate 500. The internal state machine logic is such that when a control signal 504 produced by a logic gate 500 is high, the cycle or stage corresponding to the input to that logic gate is skipped. For example, if output signal 504 of OR gate 508 is high, then the program verify stage is skipped. With flow control register control signal 501 high, the outputs of each of the OR gates will be high. As a result, the cycles or stages corresponding to the second input to those gates will be skipped. For the purposes of the internal program verify mode it is desired to skip the erase high voltage and distribution tightening cycles, as well as the erase verify, program verify, and final erase stages of the complete erase operation. Thus, it is desired that the outputs 504 of logic gates 506, 508, 510, 514, and 516 be high. This will cause state machine 20 to skip the desired operations.

Conversely, because of the use of inverter 520, when signal 501 goes high (indicating that the internal program verify mode has been entered), one input to AND gates 512 and 518 is low. Therefore, output signal 504 of AND gates 512 and 518 is low and the corresponding cycle or stage (in this case the pre-programming cycle and pre-programming verify stage) are not skipped and instead are implemented. With the arrangement of logic gates shown in FIG. 8, when flow control register signal 501 goes high, the outputs 504 of logic gates 500 will cause state machine 20 to implement the pre-programming cycle and pre-programming verify stage and skip the other cycles and stages of the complete erase operation. It is noted that as previously discussed, entry into the internal data verification test mode also acts to generate a control signal which causes the high voltage stages of the pre-programming cycle to be skipped. These actions will result in executing the internal program verify test mode of the present invention. The use of logic gates 500 and inverter 520 allows automatic control of the cycles and stages of the complete erase operation which are implemented when the internal verify mode is entered.

Figure 9:
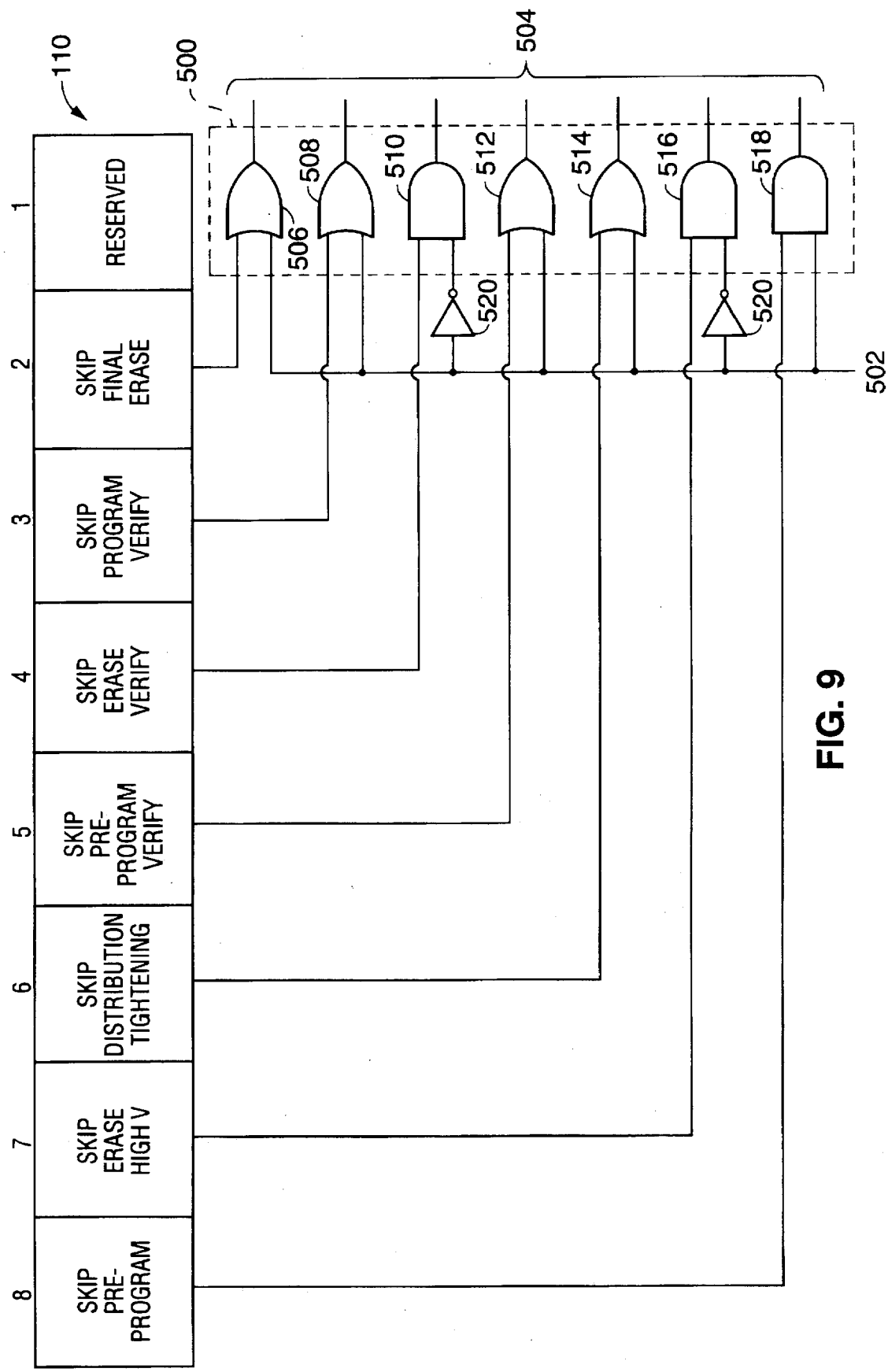
FIG. 9 shows a set of logic gates which can be used in conjunction with a flow control register control signal to automatically provide signals to cause a state machine to implement an internal erase verify mode by skipping the desired cycles or stages of a complete erase operation.

FIG. 9 shows a set of logic gates 500 which can be used in conjunction with flow control register control signal 502 to automatically provide signals 504 to cause state machine 20 to implement an internal erase verify mode by skipping the desired cycles or stages of a complete erase operation. As shown in the figure, logic gates 500 comprise a set of two-input OR gates (gates 506, 508, 512, 514, and 518) and two-input AND gates 510 and 516. As with FIG. 8, a first input to each logic gate 500 is a signal representing the contents of each bit of flow control register 110. The second input to each logic gate 500 is flow control register control signal 502 or an inverted version of that signal which is provided by an inverter 520 placed in the signal path between signal 502 and the second input to the appropriate logic gate 500. Again it is assumed that the internal state machine logic is such that when a control signal 504 produced by a logic gate 500 is high, the cycle or stage corresponding to the input to that logic gate is skipped. With flow control register control signal 502 high, the outputs of each of the OR gates will be high. As a result, the cycles or stages corresponding to the second input to those gates will be skipped. For the purposes of the internal erase verify mode it is desired to skip the pre-programming and distribution tightening cycles, as well as the pre-program verify, program verify, and final erase stages of the complete erase operation. Thus, it is desired that the outputs 504 of logic gates 506, 508, 512, 514, and 518 be high. This will cause state machine 20 to skip the desired operations.

Conversely, because of the use of inverter 520, when signal 502 goes high (indicating that the internal erase verify mode has been entered), one input to AND gates 512 and 518 is low. Therefore, output signal 504 of AND gates 510 and 516 is low and the corresponding cycle or stage (in this case the high voltage erase cycle and erase verify stage) are not skipped and instead are implemented. With the arrangement of logic gates shown in FIG. 9, when flow control register signal 502 goes high, the outputs 504 of logic gates 500 will cause state machine 20 to implement the high voltage erase cycle and erase verify stage and skip the other cycles and stages of the complete erase operation. It is noted that as previously discussed, entry into the internal data verification test mode also acts to generate a control signal which causes the high voltage stages of the high voltage erase cycle to be skipped. These actions will result in executing the internal erase verify test mode of the present invention.

If the flow control register of FIG. 7B is used, then it is necessary to set the bits of flow control register 110 so that the erase high voltage 220 and distribution adjustment 240 cycles, and the high voltage stages of the pre-programming cycle are skipped in order to execute a program verify operation. This corresponds to setting bits 7, 6, and 1 of flow control register 110. A complete erase operation is then executed. It is noted that this means of executing the internal data verification procedure does not require placing the memory system into a separate internal verify test mode of operation.

Similarly, if the flow control register of FIG. 7B is used, it is necessary to set the bits of flow control register 110 so that the pre-programming 200 and distribution adjustment 240 cycles, and the high voltage stages of the erase cycle are skipped in order to execute an erase verify operation. This corresponds to setting bits 8, 6, and 1 of flow control register 110. A complete erase operation is then executed. It is noted that this means of executing the internal data verification procedure does not require placing the memory system into a separate internal verify test mode of operation.

As noted, in order to conduct a programming operation data verification which verifies that a zero has been written to each memory cell, a modified version of the pre-programming cycle can be executed. Similarly, a modified version of the high voltage erase operation can be executed in order to verify that a one has been written to each memory cell. However, it may also be desired to conduct an internal data verification procedure in which the presence of data other than a zero or one in every cell is verified.

In the case of a data verification operation using data specified by a test engineer, this goal can be accomplished by setting the bits of the embodiment of flow control register 110 of FIG. 7B so that the high voltage erase 220 and distribution adjustment 240 cycles of the complete erase operation, and the high voltage stages of the pre-programming cycle are skipped. The memory system is then placed into a test mode in which user specified data is placed into input data latch 30 and the pre-programming cycle is executed using that data for verification purposes.

One means of providing the desired data for an internal data verification operation is described in U.S. Patent Application 08/589,754, entitled "Non-volatile Memory System-Including Apparatus for Testing Memory Elements by Writing and Verifying Data Patterns", filed the same day as this application, the contents of which is hereby incorporated in full by reference. By entering the external pattern write test mode described in the above-identified application, data input to I/O pins 15 is placed into data latch 30 and used during the data verification mode of the present invention. By executing the remaining stages of the pre-program cycle (by executing the complete erase operation), the internal program verification mode of FIG. 4 will be carried out using the user specified data. The combination of using the flow control register of FIG. 7B and the external pattern test mode permits the internal data verification mode of the present invention to be executed using data other than all ones or all zeros.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A memory system having a standard mode of operation in which a user can program, erase, and read a memory cell, and a test mode of operation in which a non-standard mode of operation can be executed, wherein access to the test mode of operation occurs upon detection of a test mode access state different from those states which occur during the standard mode of operation, the memory system comprising:

an array of memory cells;

a test mode detector which detects the test mode access state, wherein the test mode access state is different from those states which occur during the standard mode of operation;

an internal program verify circuit which executes an internal program verify operation when the memory system is placed into an internal program verify mode of operation by the test mode detector, wherein the internal program verify circuit further comprises a memory cell accessor which accesses a memory cell in the array;

a programmed data verification circuit which verifies data programmed into the memory cell; and an address incrementer which increments an address of the memory cell; and a test mode status indicator accessible to a user of the test mode which indicates success or failure of the operation executed when the memory system is placed into the internal program verify mode of operation by the test mode detector.

2. The memory system of claim 1, wherein the programmed data verification circuit further comprises:

a threshold voltage circuit which determines a threshold voltage of the memory cell; and a comparator which compares the threshold voltage to a program operation reference voltage.

3. The memory system of claim 1, further comprising:

a controller for controlling execution of a memory erase operation which includes a plurality of memory erase sub-operations, the memory erase sub-operations including a regular memory pre-programming operation which accesses a memory cell in the array, programs the accessed memory cell with data indicative of a logic value of zero, verifies the programmed data, increments the address of the memory cell, and executes the regular pre-programming operation on a memory cell having an address corresponding to the incremented address, wherein the internal program verify circuit further comprises:

a flow controller for causing the controller to bypass one of the plurality of memory erase sub-operations.

4. The memory system of claim 3, wherein the flow controller bypasses the memory erase sub-operation in response to control parameters stored in a data storage element of the memory system.

5. The memory system of claim 4, further comprising:

a control parameter generator which generates the control parameters for bypassing the erase sub-operation in response to a control signal which initiates execution of the internal program verify operation.

6. The memory system of claim 3, wherein the flow controller bypasses a memory erase sub-operation not involved in the internal program verify operation.

7. The memory system of claim 3, wherein the memory system executes a high voltage stage in which a high voltage pulse is applied to a memory cell during a pre-programming operation, and wherein the test mode detector further comprises:

a high voltage control signal generator which generates a high voltage stage control signal which causes the high voltage stage to be bypassed when the memory system is placed into an internal program verify mode of operation by the test mode detector.

8. A memory system having a standard mode of operation in which a user can program, erase, and read a memory cell, and a test mode of operation in which a non-standard mode of operation can be executed, wherein access to the test mode of operation occurs upon detection of a test mode access state different from those states which occur during the standard mode of operation, the memory system comprising:

an array of memory cells;

a test mode detector which detects the test mode access state, wherein the test mode access state is different from those states which occur during the standard mode of operation;

an internal erase verify circuit which executes an internal erase verify operation when the memory system is placed into an internal erase verify mode of operation by the test mode detector, wherein the internal erase verify circuit further comprises a memory cell accessor which accesses a memory cell in the array;

an erase verification circuit which verifies that the memory cell has been erased; and an address incrementer which increments an address of the memory cell; and a test mode status indicator accessible to a user of the test mode which indicates success or failure of the operation executed when the memory system is placed into the internal erase verify mode of operation by the test mode detector.

9. The memory system of claim 8, wherein the erase verification circuit further comprises:

a threshold voltage circuit which determines a threshold voltage of the memory cell; and a comparator which compares the threshold voltage to an erase operation reference voltage.

10. (Amended) The memory system of claim 8, further comprising:

a controller for controlling execution of a memory erase operation which includes a plurality of memory erase sub-operations, the memory erase sub-operations including a regular memory high voltage erase operation in which a high voltage erase operation is performed on a block of memory cells, a memory cell in the block is accessed, an erased state of the accessed memory cell is verified, the address of the memory cell is incremented, and the erased state verification operation is performed on a memory cell having an address corresponding to the incremented address, wherein the internal erase verify circuit further comprises:

a flow controller for causing the controller to bypass one of the plurality of memory erase sub-operations.

11. The memory system of claim 10, wherein the flow controller bypasses the memory erase sub-operation in response to control parameters stored in a data storage element of the memory system.

12. The memory system of claim 11, further comprising:

a control parameter generator which generates the control parameters for bypassing the erase sub-operation in response to a control signal which initiates execution of the internal erase verify operation.

13. The memory system of claim 10, wherein the flow controller bypasses a memory erase sub-operation not involved in the internal erase verify operation.

14. The memory system of claim 10, wherein the memory system executes a high voltage stage in which a high voltage pulse is applied to a memory cell during an erase operation, and wherein the test mode detection means further comprises:

a high voltage control signal generator which generates a high voltage stage control signal which causes the high voltage stage to be bypassed when the memory system is placed into an internal erase verify mode of operation by the test mode detector.

15. A memory system comprising:

an array of memory cells;

a controller for controlling execution of a memory erase operation which includes a plurality of memory erase sub-operations, the memory erase sub-operations including a regular memory pre-programming operation which accesses a memory cell in the array, programs the accessed memory cell with data indicative of a logic value of zero, verifies the programmed data, increments the address of the memory cell, and executes the regular pre-programming operation on a memory cell having an address corresponding to the incremented address; and a control modifier which modifies the operation of the controller to cause the controller to execute an internal program verify operation on the memory cells of the memory array, the internal program verify operation including accessing a memory cell in the array, verifying data programmed into the memory cell, and incrementing an address of the memory cell.

16. The memory system of claim 15, further comprising:

an internal program verify modifier which modifies execution of the internal program verify operation so that the data programmed into the cell which is verified is data input by a user.

17. A memory system comprising:

an array of memory cells;

a controller for controlling execution of a memory erase operation which includes a plurality of memory erase sub-operations, the memory erase sub-operations including a regular memory high voltage erase operation in which a high voltage erase operation is performed on a block of memory cells, a memory cell in the block is accessed, an erased state of the accessed memory cell is verified, the address of the memory cell is incremented, and, the erased state verification operation is performed on a memory cell having an address corresponding to the incremented address; and a control modifier which modifies the operation of the controller to cause the controller to execute an internal erase verify operation on the memory cells of the memory array, the internal erase verify operation including accessing a memory cell in the array, verifying that the memory cell has been erased, and incrementing an address of the memory cell.

18. A method of verifying a state of a memory cell contained in a memory array of a memory system, the memory system having a standard mode of operation in which a user can program, erase, and read a memory cell and a test mode of operation in which a non-standard mode of operation can be executed, wherein access to the test mode of operation occurs upon detection of a test mode access state different from those states which occur during the standard mode of operation, the method comprising:

accessing the test mode of operation;

placing the memory system into an internal program verify mode of operation;

executing an internal program verify operation when the memory system is placed into the internal program verify mode of operation, wherein the step of executing the internal program verify operation further comprises accessing a memory cell in the array;

verifying data programmed into the memory cell; and incrementing an address of the memory cell; and setting a bit of a test mode status register accessible to a user of the test mode indicating success or failure of the internal program verify operation.

19. The method of claim 18, wherein the step of verifying data programmed into the memory cell further comprises:

determining a threshold voltage of the memory cell and comparing it to a program operation reference voltage.

20. The method of claim 18, wherein the memory system includes a controller for controlling execution of a memory erase operation which includes a plurality of memory erase sub-operations, the memory erase sub-operations including a regular memory pre-programming operation which accesses a memory cell in the array, programs the accessed memory cell with data indicative of a logic value of zero, verifies the programmed data, increments the address of the memory cell, and executes the regular pre-programming on a memory cell having an address corresponding to the incremented address, and wherein the method further comprises:

causing the controller to bypass a memory erase sub-operation not involved in the internal program verify operation.

21. The method of claim 20, wherein the step of causing the controller to bypass a memory erase sub-operation further comprises:

generating a control signal which causes the controller to bypass the memory sub-operation in response to placing the memory system into an internal program verify mode of operation.

22. A method of verifying a state of a memory cell contained in a memory array of a memory system, the memory system having a standard mode of operation in which a user can program, erase, and read a memory cell and a test mode of operation in which a non-standard mode of operation can be executed, wherein access to the test mode of operation occurs upon detection of a test mode access state different from those states which occur during the standard mode of operation, the method comprising:

accessing the test mode of operation;

placing the memory system into an internal erase verify mode of operation;

executing an internal erase verify operation when the memory system is placed into an internal erase verify mode of operation, wherein the step of executing the internal erase verify operation further comprises accessing a memory cell in the array;

verifying that the memory cell has been erased; and incrementing an address of the memory cell; and setting a bit of a test mode status register accessible to a user of the test mode indicating success or failure of the internal erase verify operation.

23. The method of claim 22, wherein the step of verifying that the memory cell has been erased further comprises:

determining a threshold voltage of the memory cell and comparing it to an erase operation reference voltage.

24. The method of claim 22, wherein the memory system includes a controller for controlling execution of a memory erase operation which includes a plurality of memory erase sub-operations, the memory erase sub-operations including a regular memory high voltage erase operation in which a high voltage erase operation is performed on a block of memory cells, a memory cell in the block is accessed, an erased state of the accessed memory cell is verified, the address of the memory cell is incremented, and the erased state verification operation is performed on a memory cell having an address corresponding to the incremented address, and wherein the method further comprises:

causing the controller to bypass a memory erase sub-operation not involved in the internal erase verify operation.

25. The method of claim 24, wherein the step of causing the controller to bypass a memory erase sub-operation further comprises:

generating a control signal which causes the controller to bypass the memory sub-operation in response to placing the memory system into an internal erase verify mode of operation.

26. A method of verifying a state of a memory cell contained in a memory array of a memory system, the memory system including a controller which controls execution of a memory erase operation which includes a plurality of memory erase sub-operations, the memory erase sub-operations including a regular memory pre-programming operation which accesses a memory cell in the array, programs the accessed memory cell with data indicative of a logic value of zero, verifies the programmed data, increments the address of the memory cell, and executes the regular pre-programming on a memory cell having an address corresponding to the incremented address, the method comprising:

causing the controller to bypass the memory sub-operations not involved in an internal program verify operation; and executing an internal program verify operation, wherein the step of executing the internal program verify operation further comprises:
accessing a memory cell in the array;
verifying data programmed into the memory cell; and
incrementing an address of the memory cell.

27. The method of claim 26, wherein the step of verifying data programmed into the memory cell further comprises:

determining a threshold voltage of the memory cell and comparing it to a program operation reference voltage.

28. The method of claim 26, wherein the step of executing an internal program verify operation further comprises:

setting a status register bit indicating success or failure of the internal program verify operation.

29. A method of verifying a state of a memory cell contained in a memory array of a memory system, the memory system including a controller which controls execution of a memory erase operation which includes a plurality of memory erase sub-operations, the memory erase sub-operations including a regular memory high voltage erase operation in which a high voltage erase operation is performed on a block of memory cells, a memory cell in the block is accessed, an erased state of the accessed memory cell is verified, the address of the memory cell is incremented, and the erased state verification operation is performed on a memory cell having an address corresponding to the incremented address, the method comprising:

causing the controller to bypass the memory sub-operations not involved in an internal erase verify operation; and executing an internal erase verify operation, wherein the step of executing the internal erase verify operation further comprises:
accessing a memory cell in the array;
verifying that the memory cell has been erased; and
incrementing an address of the memory cell.

30. The method of claim 29, wherein the step of verifying that the memory cell has been erased further comprises:

determining a threshold voltage of the memory cell and comparing it to an erase operation reference voltage.

31. The method of claim 29, wherein the step of executing an internal erase verify operation further comprises:

setting a status register bit indicating success or failure of the internal erase verify operation.

* * * * *